United States Patent [19]

Kawamura et al.

[11] Patent Number: 5,698,369
[45] Date of Patent: Dec. 16, 1997

[54] PHOTOSENSITIVE COMPOSITION COMPRISING A SULFONIMIDE COMPOUND ACCORDING TO THE FORMULA $R_1$-$SO_2$-$NR_3$-$SO_2$-$R_2$ WHEREIN $R_1$, $R_2$ AND $R_3$ EACH REPRESENTS AN AROMATIC GROUP OR AN ALKYL GROUP

[75] Inventors: Koichi Kawamura; Fumikazu Kobayashi; Tsukasa Yamanaka, all of Shizuoka, Japan

[73] Assignee: Fuji Photo Film Co., Ltd., Kanagawa, Japan

[21] Appl. No.: 488,450

[22] Filed: Jun. 7, 1995

Related U.S. Application Data

[63] Continuation of Ser. No. 271,976, Jul. 8, 1994, abandoned.

[30] Foreign Application Priority Data

Jul. 8, 1993 [JP] Japan .................. 5-169032

[51] Int. Cl.$^6$ .................................. G03C 1/73
[52] U.S. Cl. .................. 430/281.1; 430/270.1; 522/59; 522/65
[58] Field of Search .................. 430/281.1, 270.1; 522/59, 49, 65

[56] References Cited

U.S. PATENT DOCUMENTS

| 4,639,408 | 1/1987 | Kitaguchi et al. ............... 430/351 |

FOREIGN PATENT DOCUMENTS

| 0 520 265 A2 | 12/1992 | European Pat. Off. . |
| 0 520 265 A2 | 6/1992 | Germany . |
| 61-124941 | 6/1986 | Japan . |
| 61-147244 | 7/1986 | Japan . |
| 2-120739 | 5/1990 | Japan . |
| 2-123354 | 5/1990 | Japan . |
| 2-123354 | 6/1990 | Japan . |

*Primary Examiner*—George F. Lesmes
*Assistant Examiner*—Laura Weiner
*Attorney, Agent, or Firm*—Sughrue, Mion, Zinn, Macpeak & Seas, PLLC

[57] ABSTRACT

Disclosed is a photosensitive composition comprising a sulfonimide compound represented by formula (I):

$$R_1\text{—}SO_2\text{—}NR_3\text{—}SO_2\text{—}R_2 \qquad (I)$$

wherein $R_1$, $R_2$ and $R_3$ each represents an unsubstituted or substituted aromatic group or an unsubstituted or substituted alkyl group.

13 Claims, No Drawings

PHOTOSENSITIVE COMPOSITION COMPRISING A SULFONIMIDE COMPOUND ACCORDING TO THE FORMULA R₁-SO₂-NR₃-SO₂-R₂ WHEREIN R₁, R₂ AND R₃ EACH REPRESENTS AN AROMATIC GROUP OR AN ALKYL GROUP

This is a Continuation of application Ser. No. 08/271,976 filed Jul. 8, 1994, now abandoned.

FIELD OF THE INVENTION

The present invention relates to photosensitive compositions with contain a compound capable of decomposing by exposure to light to produce a free radical or an acid. In particular, it is concerned with photosensitive compositions containing a sulfonimide compound as photodecomposable compound.

BACKGROUND OF THE INVENTION

Compound of the types which can produce free radicals or acids under photolysis well known in the fields of graphic arts, photoresist, coating and dental articles. They are widely used as photopolymerization initiator in photopolymerizable compositions, and as photoacid generator in the reactions to be catalyzed by acids generated under exposure to light, such as polymerization, cross-linking deprotection, elimination and decomposition reactions. Further, the acid generating compounds under photolysis have been generally used as dissolution accelerators in the fields of photoresist and PS (presensitized) plate.

Well-known examples of compounds of the type which generate acids or free radicals under photolysis by exposure include halogen-containing organic compounds. Such organic compounds undergo photolysis to produce halogen radicals such as chlorine or bromine radicals. These halogens radicals function effectively as hydrogen drawing-out agent, and produce acids when hydrogen donors are present. In addition, halogen radicals are excellent polymerization initiators, and cause a polymerization reaction when they are present together with compounds containing polymerizable double bonds. Application of these radicals to photographic processes and photopolymerization processes is described, e.g., in J. Kosar, *Light Sensitive Systems*, pages 180–181 and 361–370, J. Willy & Sons, New York (1965).

As compounds capable of producing halogen radicals by the action of light, there have been widely used trichloromethyl-s-triazine compounds as well as carbon tetrabromide, iodoform and tribromoacetophenone and the like.

Specific examples of trichloromethyl-s-triazine compounds and the method of using them as photopolymerization initiator or photoacid generator include, for example, the aminophenyl group-containing compounds and their use as disclosed in DE-C2-3726001, and sulfonate group-containing compounds and their use as disclosed in EP-A-0519298 and EP-A-0519299. As other examples of trichloromethyl-s-triazine compounds, mention may be made of those compounds described in *Chemical Review*, vol. 93, pages 435–448, published by American Chemical Society (1993) and the references cited therein.

Other examples of compounds capable of decomposing under exposure to produce free radicals or acids include onium salts such as iodonium salts, sulfonium salts, diazonium salts, etc. Specific examples of such onium salts and their uses are described, for example, in the following references.

U.S. Pat. No. 4,837,124 discloses the diphenyl iodinium salt used as acid generator in a positive photoresist composition.

EP-B-0102540 discloses the triphenyl sulfonium salt used as acid generator in a positive photoresist composition.

Further, EP-A-0420827 and EP-A-0425891 disclose the diaryl iodonium salt or the triarylsulfonium salt used in a negative photoresist composition.

Furthermore, U.S. Pat. No. 4,985,332 discloses a diazonium salt used as acid generator in a positive photoresist composition.

Still other examples of compounds capable of decomposing under exposure to produce free radicals or an acid include the disulfone compounds as disclosed in EP-A-0520265, the 1-sulfonyl-2-pyridone compounds disclosed in EP-A-0510440 and EP-A-0510443, the sulfonic acid ester compounds disclosed in EP-A-0510441 and EP-A-0510446, and so on.

Further examples of compounds capable of decomposing under exposure to produce an acid include quinone diazide compounds. Specific examples of quinone diazide compounds are described in V. V. Ershov et al., *Quinone Diazides*, ELSEVIER SCIENTIFIC PUBLISHING COMPANY (1981). As well known, naphthoquinone diazide produces carboxylic acid when it is exposed to light, and the carboxylic acid produced functions as dissolution inhibitor at the time of development with an alkali. Therefore, the combined use of naphthoquinone diazide and a novolak resin has many uses as positive photosensitive composition, including positive PS plate, positive photoresist and so on.

Those conventional photodecomposable compounds have been widely used as acid generator, radical generator or dissolution inhibitor. However, they were not always satisfactory in respects of safety from toxicity, explosion and the like, thermal stability, production suitability and so on.

SUMMARY OF THE INVENTION

Therefore, an object of the present invention is to provide novel photosensitive compositions containing photodecomposable compounds having excellent properties in regard to safety, thermal stability and production suitability.

The present inventors have made intensive studies in order to attain the above-described object, thereby achieving the present invention. That is, the present invention provides photosensitive compositions containing sulfonimide compounds represented by the following general formula (I):

$$R_1—SO_2—NR_3—SO_2—R_2 \qquad (I)$$

wherein $R_1$, $R_2$ and $R_3$ each represents an unsubstituted or substituted aromatic group or an unsubstituted or substituted alkyl group.

DETAILED DESCRIPTION OF THE INVENTION

When any of $R_1$, $R_2$ and $R_3$ represents an unsubstituted or substituted aromatic group in the compound of general formula (I), the aromatic group includes those of carbon ring type and those of hetero ring type. The carbon ring type aromatic groups (simply referred to as "aromatic group") include those containing 6 to 19 carbon atoms. Of the carbon ring type aromatic groups, those constituted of 1 to 4 benzene rings, such as phenyl, naphthyl, anthracenyl, pyrenyl and the like, are preferred. On the other hand, the hetero ring type aromatic groups (referred to as "heterocyclic aromatic group") include those containing 3 to 20 carbon atoms and 1 to 5 hetero atoms. Of such groups, a pyridyl group, a furyl group and groups in which benzene and hetero rings are fused together, such as quinolyl, benzofuryl, thioxanthonyl, carbazolyl and like groups, are preferred in particular.

When any of $R_1$, $R_2$ and $R_3$ represents an unsubstituted or substituted alkyl group, the alkyl group includes those containing 1 to 25 carbon atoms. Of these groups, straight-chain or branched alkyl groups containing 1 to 8 carbon atoms, such as methyl, ethyl, isopropyl, t-butyl and the like, are preferred in particular.

When any of $R_1$, $R_2$ and $R_3$ represents a substituted aromatic group, a substituted heterocyclic aromatic group or a substituted alkyl group, the substituents of these groups include alkoxy groups containing 1 to 10 carbon atoms such as methoxy, ethoxy; halogen atoms such as fluorine, chlorine, bromine; alkoxycarbonyl or aryloxycarbonyl groups containing 2 to 15 carbon atoms such as methoxycarbonyl, ethoxycarbonyl, t-butyloxycarbonyl, p-chlorophenyloxy-carbonyl; a hydroxyl group; acyloxy groups containing 2 to 15 carbon atoms such as acetyloxy, benzoyloxy, p-diphenylaminobenzoyloxy; carbonate groups such as t-butyloxycarbonyloxy; ether groups such as t-butyloxycarbonylmethyloxy, 2-pyranyloxy; substituted (e.g., by a substituted or unsubstituted alkyl group, a substituted or unsubstituted aromatic group) or unsubstituted amino groups such as amino, dimethylamino, diphenylamino, morpholino, acetylamino; thioether groups such as methylthio, phenylthio; alkenyl groups containing 2 to 15 carbon atoms such as vinyl, styryl; a nitro group; a cyano group; acyl groups containing 2 to 15 carbon atoms such as formyl, acetyl, benzoyl; aromatic groups containing 6 to 19 carbon atoms such as phenyl, naphthyl; heterocyclic aromatic groups (as defined above), such as pyridyl; and so on.

In addition to the above-cited ones, alkyl groups containing 1 to 25 carbon atoms, preferably 1 to 8 carbon atoms such as methyl, ethyl and the like are further included in the substituents when any of $R_1$, $R_2$ and $R_3$ is a substituted aromatic group or a substituted heterocyclic aromatic group.

Specific examples of a compound used in the present invention which is represented by general formula (I) are illustrated below in Table 1.

TABLE 1

| No. | Compound |
| --- | --- |
| 1 | Ph—SO$_2$NSO$_2$—Ph, N-substituent: CH$_3$ |
| 2 | CH$_3$—C$_6$H$_4$—SO$_2$NSO$_2$—C$_6$H$_4$—CH$_3$, N-substituent: C$_6$H$_5$ |
| 3 | Ph—SO$_2$—N(CH$_3$)—SO$_2$—(1-naphthyl) |
| 4 | Ph—SO$_2$—N(CH$_3$)—SO$_2$—(2-naphthyl) |
| 5 | CH$_3$O—C$_6$H$_4$—SO$_2$NSO$_2$—C$_6$F$_5$, N-substituent: CH$_3$ |
| 6 | CH$_3$O—C$_6$H$_4$—SO$_2$NSO$_2$—(2,4-dichlorophenyl), N-substituent: CH$_3$ |

TABLE 1-continued
| No. | Compound |
|---|---|
| 7 | 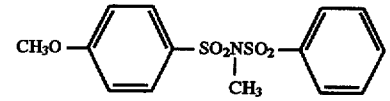 |
| 8 | 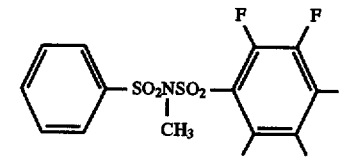 |
| 9 | 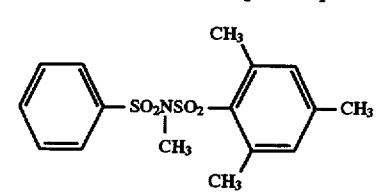 |
| 10 | 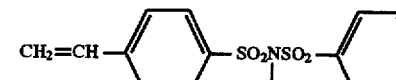 |
| 11 | 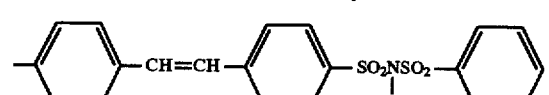 |
| 12 | 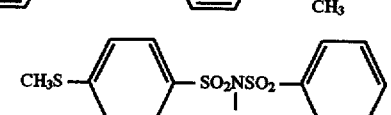 |
| 13 | 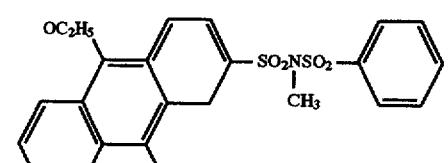 |
| 14 | 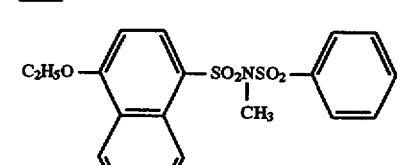 |
| 15 | 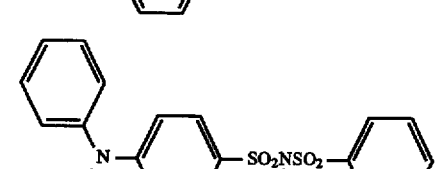 |
| 16 | 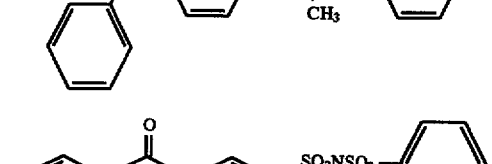 |

TABLE 1-continued

| No. | Compound |
|---|---|
| 17 | (C₆H₅)₂N–C₆H₄–C(=O)O–C₆H₄–SO₂N(CH₃)SO₂–C₆H₅ |
| 18 | t-C₄H₉O–C(=O)O–C₆H₄–SO₂N(CH₃)SO₂–(6-ethoxy-2-naphthyl) |
| 19 | (C₂H₅OC(=O)CH₂)₂N–C₆H₄–SO₂N(CH₃)SO₂–C₆H₅ |
| 20 | 4-CH₃O–C₆H₄–SO₂N(CH₃)SO₂–(3,4-dimethoxyphenyl) |
| 21 | 4-CH₃O–C₆H₄–SO₂N(CH₃)SO₂–CH₃ |
| 22 | C₆H₅–SO₂N(CH₂CO₂C₂H₅)SO₂–C₆H₅ |
| 23 | C₆H₅–SO₂N(4-chlorophenyl)SO₂–C₆H₅ |
| 24 | C₆H₅–SO₂N(CH₂–CO₂–t–C₄H₉)SO₂–C₆H₅ |
| 25 | 4-CH₃O–C₆H₄–SO₂N(CH₃)SO₂CH₂CH₃ |
| 26 | 4-CH₃O–C₆H₄–SO₂N(CH₃)SO₂–C₆H₄–4-OCH₃ |

TABLE 1-continued

| No. | Compound |
|---|---|
| 27 | 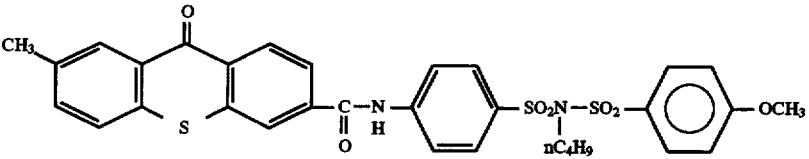 |

The compounds represented by general formula (I) can be easily synthesized by the dehydrochlorination condensation of a sulfonamide represented by the following general formula (II) and a sulfonyl chloride represented by the following general formula (III) which is conducted in an appropriate solvent (e.g., acetonitrile, dichloromethane, tetrahydrofuran, acetone, ethyl acetate, dimethylacetamide, dimethylformamide) in the presence of an organic base (e.g., triethylamine, dimethylaminopyridine, DBU (which stands for 1,8-diazabicyclo-7-undecene)) or an inorganic base (e.g., sodium hydride, lithium hydride, sodium hydroxide, potassium carbonate):

 (II)

 (III)

wherein $R_1$, $R_2$ and $R_3$ have the same meanings as those in general formula (I) respectively.

The compounds represented by the above general formulae (II) and (III) are easily obtained as commercial products.

Synthesis examples of a photodecomposable compound used in the present invention are described below.

SYNTHESIS EXAMPLE 1

Synthesis of Compound No. 1

17.1 g (0.1 mole) of N-Methylbenznesulfonamide, 24.3 g (0.24 mole) of triethylamine, 1.2 g (0.01 mole) of dimethylaminopyridine and 50 ml of acetonitrile were placed in a 300 ml three-necked flask. Thereinto was dripped 25.6 g (0.15 mole) of benzenesulfonyl chloride dissolved in 50 ml of acetonitrile at a temperature lower than 20° C. After the dripping, the mixture was stirred for 4 hours at room temperature, and then allowed to stand for one night.

The resulting reaction mixture was poured into 500 ml of water, extracted with 400 ml of ethyl acetate, dried over magnesium sulfate, and then concentrated. The concentrate thus obtained was recrystallized from ethanol to give 25.8 g of crystalline Compound No. 1. The yield of the product was 82%, and the melting point thereof was 103°–104° C.

Absorption spectrum (in THF): $\lambda_{max}$, 226 nm; $\epsilon$, 1.63× $10^4$.

Anal. Found: C, 50.25%; H, 4.10%; N, 4.72%.

SYNTHESIS EXAMPLE 2

Synthesis of Compound No. 2

24.7 g (0.1 mole) of p-toluenesulfonanilide, 24.3 g (0.24 mole) of triethylamine, 1.2 g (0.01 mole) of dimethylaminopyridine and 50 ml of acetonitrile were placed in a 300 ml three-necked flask. Thereinto was dripped 28.6 g (0.15 mole) of p-toluenesulfonyl chloride dissolved in 100 ml of acetonitrile at a temperature lower than 20° C. After the dripping, the mixture was stirred for 3 hours at room temperature, and then allowed to stand for one night.

The resulting reaction mixture was poured into 500 ml of water, extracted with 2.2 l of ethyl acetate, dried over magnesium sulfate, and then concentrated. The concentrate thus obtained was recrystallized from ethanol to give 35.0 g of crystalline Compound No. 2. The yield of the product was 86%, and the melting point thereof was 183.5°–185° C.

Absorption spectrum (in THF): $\lambda_{max}$, 237 nm; $\epsilon$, 2.66× $10^4$.

Anal. Found: C, 59.53%; H, 4.95%; N, 3.41%.

SYNTHESIS EXAMPLE 3

Synthesis of Compound No. 3

8.6 g (0.05 mole) of N-methylbenznesulfonamide, 12.1 g (0.12 mole) of triethylamine, 0.6 g (0.005 mole) of dimethylaminopyridine and 25 ml of acetonitrile were placed in a 200 ml three-necked flask. Thereinto was dripped 17.0 g (0.075 mole) of α-naphthalenesulfonyl chloride dissolved in 65 ml of acetonitrile at a temperature lower than 20° C. After the dripping, the mixture was stirred for 3 hours at room temperature, and then allowed to stand for one night. The resulting reaction mixture was poured into 500 ml of water to precipitate crystals.

The crystals were filtered off, and recrystallized from acetonitrile to give 13.5 g of crystalline Compound No. 3. The yield of the product was 74%, and the melting point thereof was 180.5°–182° C.

Absorption spectrum (in THF): $\lambda_{max}$, 227 nm; $\epsilon$, 3.52× $10^4$.

Anal. Found: C, 56.50%; H, 4.30%; N, 3.85%.

SYNTHESIS EXAMPLES 4 TO 14

Compounds set forth in Table 2 were synthesized in the same manner as Compounds 1 to 3. The data on physical properties of the compounds thus obtained are shown in Table 2.

TABLE 2

| Synthesis ex. | Comp. No. | m.p. (°C.) | $\lambda_{max}$ (nM) in THF | $\epsilon$ | Anal. Found (%) C | H | N |
|---|---|---|---|---|---|---|---|
| 4 | 4 | 123–124.5 | 235 | $6.19 \times 10^4$ | 56.50 | 4.15 | 3.86 |
| 5 | 5 | 100–101 | 249 | $2.00 \times 10^4$ | 38.58 | 2.51 | 3.30 |
| 6 | 6 | 174–176 | 247 | $1.97 \times 10^4$ | 40.81 | 3.23 | 3.28 |
| 7 | 7 | 96.5–96.8 | 247 | $2.08 \times 10^4$ | 49.15 | 4.40 | 4.03 |
| 8 | 8 | 109–110.5 | 266 | $0.7 \times 10^4$ | 38.90 | 2.21 | 6.53 |
| 9 | 9 | 152.5–152.4 | 235 | $1.26 \times 10^4$ | 54.41 | 5.23 | 3.87 |
| 10 | 10 | 58.5–60.0 | 265 | $1.97 \times 10^4$ | 53.45 | 4.48 | 4.17 |
| 11 | 13 | 98–101 | 415 | $4.25 \times 10^3$ | 60.03 | 5.13 | 2.76 |
| 12 | 21 | 74–75.5 | 244 | $1.82 \times 10^4$ | 38.80 | 4.70 | 5.32 |
| 13 | 14 | 133–135 | 310 | $1.29 \times 10^4$ | 56.30 | 4.78 | 3.53 |
| 14 | 12 | 84–86 | 287 | $2.06 \times 10^4$ | 46.84 | 4.03 | 4.11 |

The compounds represented by the foregoing general formula (I) decompose efficiently to produce radicals or acids when they are irradiated with active rays of wavelengths ranging from about 200 nm to about 500 nm. Therefore, the compounds represented by general formula (I) are useful as photodecomposable compound, photoradical generator and photoacid generator in photosensitive compositions containing a photodecomposable compound as an essential constituent, photosensitive compositions containing as an essential constituent a compound capable of generating free radicals by irradiation with active rays and photosensitive compositions containing as an essential constituent a compound capable of generating an acid under active rays, respectively.

Moreover, the compounds represented by general formula (I) are superior to conventional photodecomposable compounds in safety, production suitability and thermal stability. Therefore, photosensitive compositions having good thermal stability can be prepared in safety by the use of the present compounds.

The photodecomposable compounds according to the present invention can be used as substitutes for naphthoquinonediazides, or photodecomposable compounds conventionally used in positive printing plates or positive photoresists. Naphthoquinonediazides are, as well known, highly explosive. In preparing them, therefore, the greatest possible care must be taken. On the other hand, the present photodecomposable compounds are low in explosiveness, and so they can be produced in safety.

In application of the present photodecomposable compounds as substitutes for naphthoquinonediazides to the preparation of a positive printing plate or positive photoresist, they are used in combination with at least one polymer binder of the type which is insoluble in water but soluble in aqueous alkali solution or at least capable of swelling therein. Suitable examples of such a polymer binder include novolak resins, hydrogenated novolak resins, acetone-pyrogallol resins, poly(hydroxystyrene)s, hydrogenated poly(hydroxystyrene)s, halogen- or alkyl-substituted poly(hydroxystyrene)s, hydroxystyrene-N-substituted maleinimide copolymers, partly o-alkylated or o-acylated poly(hydroxystyrene)s, styrene-maleic anhydride copolymers, and carboxyl group-containing methacrylic resins and derivatives thereof. However, the polymer binder should not be construed as being limited to the above-cited ones.

Particularly preferable alkali-soluble resins are novolak resins and poly(hydroxystyrene)s. The novolak resins are obtained using prescribed monomers as main component together with aldehydes and making them undergo addition condensation in the presence of an acid catalyst.

As for the prescribed monomers, hydroxy group-containing aromatic compounds, including phenol, cresols such as m-cresol, p-cresol, o-cresol, xylenols such as 2,5-xylenol, 3,5-xylenol, 3,4-xylenol, 2,3-xylenol, alkylphenols such as m-ethylphenol, p-ethylphenol, o-ethylphenol, p-t-butylphenol, p-octylphenol, 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, bis-alkylphenols such as 2-methyl-4-isopropylphenol, m-chlorophenol, p-chlorophenol, o-chlorophenol, dihydroxybiphenyl, bisphenol A, phenylphenol, resorcinol, naphthol and the like, can be used alone or as a mixture of two or more thereof. However, monomers usable in the present invention should not be construed as being limited to the above-cited ones.

As for the aldehydes, there can be used formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, and chloroacetaldehyde and acetals thereof such as chloroacetaldehyde diethylacetal. Of these aldehydes, formaldehyde is preferred in particular. The aldehydes cited above may be used alone or as a mixture of two or more thereof. Examples of the acid catalyst which can be used, include hydrochloric acid, sulfuric acid, formic acid, acetic acid and oxalic acid.

It is desirable that the novolak resins thus obtained have a weight average molecular weight ranging from 1,000 to 30,000. When the weight average molecular weight of the resin is less than 1,000, the unexposed area of the resulting resist film has a great decrease in thickness after development; while when the weight average molecular weight is increased beyond 30,000, the development speed is decreased. In particular, it is preferable that the weight average molecular weight of the novolak resins be in the range of 2,000 to 20,000.

Examples of other preferred polymer binders which can be used to advantage include homo- and copolymers of p-hydroxystyrene or an alkyl derivative thereof, such as 3-methylhydroxystyrene; or other polyvinylphenols, such as homo- and copolymers of 3-hydroxystyrene; and esters or amides prepared from acrylic acid and phenolic group-containing aromatic compounds. As for the comonomers which can be used in the foregoing copolymers, styrene, methacryloyl methacrylate, acryloyl methacrylate and so on are examples thereof.

When copolymers of the above-described kind are prepared using silicon-containing vinyl monomers such as vinyltrimethylsilane, mixtures having improved resistance to plasma etching can be obtained.

The same effects as described above can also be produced by using homo- and copolymers of maleimide. In this case, styrene, substituted styrenes, vinyl ethers, vinyl esters, vinylsilyl compounds and (meth)acrylic acid esters can be used as comonomers.

Further, it is also possible to use styrene copolymers together with comonomers capable of increasing their solubility in aqueous alkali solution. As for such comonomers, maleic anhydride and maleic acid half esters are examples thereof. These binder polymers can be mixed with one another. Preferably, the binder comprises at least one polymer of the above-described kind.

In addition to dyes, pigments, wetting agents and leveling agents, polyglycols and cellulose esters, such as ethyl cellulose, can optionally be added to the photodecomposable mixtures relating to the present invention, thereby effecting improvements in special factors including flexibility, adhesiveness, luster and so on.

When the present photodecomposable compound is used in combination with a polymer binder, the proportion of the photodecomposable compound ranges from 1 to 60% by weight, preferably from 5 to 40% by weight, to the total of the polymer binder and the photodecomposable compound.

In addition, the photodecomposable compounds of the present invention can be used as photoacid generator in combination with compounds containing an acid cleavable —C—O—C— or —C—O—Si— linkage.

As for the compounds containing such an acid cleavable linkage, compounds of the following kinds have been known to be effective:

(a) compounds containing at least one orthocarboxylic acid ester and/or carboxylic acid amide acetal group, and capable of undergoing polymerization, said group appearing as cross-linking element in the main chain or as a side-chain substituent in the resulting polymers;

(b) oligomeric or polymeric compounds containing a repeated acetal and/or ketal group, (c) compounds containing at least one enol ether or N-acylaminocarbonate group, (d) cyclic acetals or ketals of β-keto-esters or β-ketoamides, (e) compounds containing a silyl ether group, (f) compounds containing a silyl enol-ether group, (g) monoacetals or monoketals whose aldehyde or ketone constituent has solubility of 0.1 to 100 g/l in a developer, (h) ethers of tertiary alcohols, and (i) carboxylates or carbonates of allyl or benzyl alcohol.

The compounds of the kind (a) which can be cleaved by an acid and constitute radiation responsive mixtures are disclosed, e.g., in German Patent Application (OLS) Nos. 2,610,842 and 2,928,636. The mixtures containing the compounds of the kind (b) are disclosed, e.g., in German Patent Application (OLS) Nos. 2,306,248 and 2,718,254. The compounds of the kind (c) are disclosed, e.g., in EP-A-0006626 and EP-A-0006627. The compounds of the kind (d) are disclosed, e.g., in EP-A-0202196, and compounds used as those of the kind (e) are disclosed, e.g., in German Patent Application (OLS) Nos. 3,544,165 and 3,601,264. The compounds of the kind (f) are disclosed, e.g., in German Patent Application (OLS) Nos. 3,730,785 and 3,730,783, and those of the kind (g) are disclosed, e.g., in German Patent Application (OLS) No. 3,730,783. The compounds of the type (h) are disclosed, e.g., in U.S. Pat. No. 4,603,101, and those of the type (i) are described, e.g., in J. M. Frechet et al., J. Imaging Sci., vol. 30, pp. 59–64 (1986) as well as in U.S. Pat. No. 4,491,628.

The above-recited acid cleavable compounds can also be used as a mixture of two or more thereof.

Of the compounds of the foregoing kinds (a) to (i), those of the kinds (a), (b), (g) and (i) are favored in particular. In the kind (b) group, polymerizable acetals are particularly noteworthy; while among the acid-cleavable materials of the kind (g), the compounds whose aldehyde or ketone constituent has a boiling point higher than 150° C., preferably higher than 200° C., are especially worthy of remark.

Other preferable materials capable of being cleaved by an acid include organic high molecular compounds containing —C—O—C— or —C—O—Si— linkage(s). As for such organic high molecular compounds, those containing acid-decomposable ether, ester, carbonate, acetal, ketal or silyl ether groups are examples thereof. More specifically, those organic high molecular compounds are disclosed, e.g., in EP-A-0520265, U.S. Pat. No. 4,985,332, West German Patents 2,718,254 and 3,601,264, and U.S. Pat. No. 4,931,379.

The combination of the present photodecomposable compound and an acid-cleavable compound as described above may further be combined with at least one polymer which is insoluble in water but soluble or capable of swelling in an aqueous alkali solution, as described above.

In the combination of the present photodecomposable compound and the acid-cleavable compound, the proportion of the photodecomposable compound is in the range of 0.1 to 25% by weight, preferably 1 to 10% by weight, to the total of the photodecomposable compound, the acid-cleavable compound and the alkali-soluble or swellable polymer. On the other hand, the proportion of the acid-cleavable compound ranges from 1 to 99.9% by weight, preferably 5 to 99% by weight, and that of the alkali-soluble or swellable polymer ranges from 0 to 98% by weight, preferably from 0 to 95% by weight.

Furthermore, the present photodecomposable compounds can be combined with a compound containing at least two acid cross-linkable groups in every molecule thereof to prepare a negative photosensitive composition.

As for the compound containing acid cross-linkable groups, the resol resins disclosed in British Patent 2,082,339, the alkoxymethyl- or oxiranylmethyl-substituted aromatic compounds disclosed in EP-A-0212482 and the melamine-formaldehyde or urea-formaldehyde condensates in the form of monomer or oligomer as disclosed in EP-A-0133216 and West German Patents 3,634,371 A and 3,711,264 are examples thereof.

Of the above-cited compounds, those used in EP-A0212482 are particularly preferred as acid cross-linkable compound. Representatives of the compounds containing acid cross-linkable groups which can be used to advantage are such compounds as to contain aromatic hydrocarbon or hetero ring(s) substituted with at least two hydroxymethyl, acetoxymethyl, methoxymethyl or like groups. Of these compounds, melamine-formaldehyde resins containing at least two N-hydroxymethyl, N-alkoxymethyl or N-acryloxymethyl groups are useful in particular.

The combination of the present photodecomposable compound and a compound containing acid cross-linkable groups may further be combined with at least one polymer which is insoluble in water but soluble or capable of swelling in an aqueous alkali solution, as described above.

In the combination of the present photodecomposable compound and the acid cross-linkable compound, the proportion of the photodecomposable compound is in the range of 0.1 to 25% by weight, preferably 1 to 10% by weight, to the total of the photodecomposable compound, the acid cross-linkable compound and the alkali-soluble or swellable polymer. On the other hand, the proportion of the acid cross-linkable compound ranges from 0.1 to 99.9% by weight, preferably 1 to 50% by weight, and that of the alkali-soluble or swellable polymer ranges from 0 to 98% by weight, preferably from 0 to 95% by weight.

In addition, the present photodecomposable compounds can be used as free radical generator in combination with polymerizable ethylenic compounds.

The term polymerizable ethylenic compounds as used in the present invention is intended to include compounds containing at least one, preferably at least two, ethylenic unsaturated bonding in their respective chemical structures. Specifically, they have a chemical form of, e.g., monomer, prepolymer including dimer, trimer and oligomer, mixture thereof, or copolymer. Examples of such a monomer or copolymer include esters prepared from unsaturated carboxylic acids and aliphatic polyhydric alcohols, amides prepared from unsaturated carboxylic acids and aliphatic polyamines, and the like.

As for the monomeric esters prepared from aliphatic polyhydric alcohols and unsaturated carboxylic acids, there can be given acrylic acid esters as specific examples thereof, which include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, and so on.

Specific examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(acryloxyethoxy)phenyl]dimethylmethane, and so on.

Specific examples of monomeric amides prepared from aliphatic polyamines and unsaturated carboxylic acids include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, xylylenebismethacrylamide, and so on.

Additionally, the proportion of those monomers used is at least 5% by weight, preferably in the range of 10 to 99.5% by weight, to the whole components.

To the combination of the present photodecomposable compound and the polymerizable compound containing at least one ethylenic unsaturated bonding, a polymer binder may further be added. Of course, any polymer binders may be used therein as far as they have compatibility with photopolymerizable ethylenic unsaturated compounds. Desirably, organic high molecular weight polymers soluble or capable of swelling in water or weak alkaline water should be chosen, for they enable development with water or weak alkaline water. In other words, water development becomes feasible by the use of water-soluble organic high molecular weight polymers. As examples of such an organic high molecular weight polymer, mention may be made of the above-described polymers which are insoluble in water but soluble or at least capable of swelling in alkaline aqueous solution, including novolak resins and the like. Other organic high polymers of the above-described kind include the addition polymerization products having carboxylic acid groups in their side chains, such as methacrylic acid copolymers, acrylic acid copolymers, itaconic acid copolymers, crotonic acid copolymers, maleic acid copolymers, partly esterified maleic acid copolymers and the like, which are disclosed, e.g., in JP-A-59-44615 (the term "JP-A" as used herein means an "unexamined published Japanese patent application"), JP-B-54-34327 (the term "JP-B" as used herein means an "examined Japanese patent publication), JP-B-58-12577, JP-B-54-25957, JP-A-54-92723, JP-A-59-53836 and JP-A-59-71048. As additional examples of the above-described kind of high polymer, acidic cellulose derivatives containing carboxylic acid groups in their side chains can be cited. Further, compounds obtained by addition of cyclic acid anhydrides to the addition polymerization products containing hydroxyl groups are also useful. Of the above-cited polymers, a copolymer of benzyl(meth)acrylate and (meth)acrylic acid, which may contain other addition polymerizing vinyl monomers, if needed, and a copolymer of allyl(meth)acrylate and (meth)acrylic acid, which may contain other addition polymerizable vinyl monomers, if needed, are favored in particular.

These organic high polymers can be blended into the whole composition in an arbitrary amount. However, when the proportion of such high polymers is increased beyond 90% by weight, the images formed are unsatisfactory in respect of strength and so on.

In addition, higher fatty acid derivatives and the like, including behenic acid and behenic acid amide, may be added to the photosensitive composition, if desired. If they are added, they will come to the surface of the photosensitive layer to prevent oxygen from interfering with polymerization. The proportion of higher fatty acid derivatives is preferably in the range of about 0.5 to about 10% by weight to the whole composition. Further, dyes and pigments may be added for the purpose of coloring the photosensitive layer. The proportion of dyes and pigments to the whole composition ranges from about 0.5 to about 5% by weight. Furthermore, there may be added inorganic fillers for improving physical properties of hardened films and other conventional known additives.

The present compounds of general formula (I) are particularly useful in giving such a property as to form a vidual contrast between exposed and unexposed areas immediately after exposure without undergoing development (that is to say, a printing-out property) to the photosensitive resist forming compositions for manufacturing, e.g., lithographic printing plates, IC circuits and photomasks. The photosensitive resist compositions having such a printing-out property as described above can form visual images only by an exposure operation under yellow safelight. Accordingly, when the plate-making operation is intermitted in the course of exposing a large number of printing plates at the same time, the forgoing composition makes it possible, e.g., to know whether or not the plate has been undergone the exposure. In analogy with the above-cited case, for instance, when a worker repeats exposure operations for one large-sized plate in order to make a lithographic printing plate according to the so-called photocomposing process, he can ascertain directly what areas he has finished exposing.

A composition used for providing such a printing-out property as described above (which is abbreviated to "a printing-out composition", hereinafter) is constituted of a free radical former or an acid generator and a discoloring agent which can change its color under interaction with a free radical or an acid. In such a printing-out composition, the present compounds of general formula (I) can be used as the free radical former or the acid generator.

Discoloring agents which can be used herein can be classified into two groups. One group is composed of those which are originally colorless but can be converted to colored ones by the reaction with free radicals or acids generated from the present photodecomposable compounds; while the other group is composed of those which are colored intrinsically but can be discolored or decolored by the reaction described above.

As typical coloring agents belonging to the former group, arylamines can be instanced. The arylamines which can be used for the foregoing purpose not only include simple arylamines, such as primary and secondary aromatic amines, but also include so-called leuco dyes. Specific examples of such arylamines include diphenylamine, p,p'-tetramethyldiaminodiphenylmethane, N,N-dimethyl-p-phenylenediamine, p,p',p"-hexamethyltriaminotriphenylmethane, p,p'-tetramethyldiaminotriphenylmethane, p,p'-tetramethyldiaminodiphenylmethylimine, p,p',p"-triamino-o-methyltriphenylmethane, p,p',p"-triaminotriphenylcarbinol, and p,p'-tetramethylaminodiphenyl-4-anilinonaphthylmethane.

As for the discoloring agents of the type which are colored intrinsically but can be discolored or decolored by the reaction with acids generated from the photodecomposable compounds, various dyes including diphenylmethanes, triphenylmethanes, thiazines, oxazines, xanthenes, anthraquinones, iminonaphthoquinones, azomethines and the like are useful examples thereof.

As specific examples of such dyes, mention may be made of Brilliant Green, Eosine, Ethyl Violet, Erythrocin B, Methyl Green, Crystal Violet, Basic Fuchsine, phenolphthalein, 1,3-diphenyltriazine, Alizarin Red S, thymolphthalein, Methyl Violet 2B, Quinaldine Red, Rose Bengale, Metanil Yellow, thymolsulfophthalein, Xylenol Blue, Methyl Orange, Orange IV, diphenyl thiocarbazone, 2,7-dichlorofluorescein, Para Methyl Red, Congo Red, Benzopurpurine 4B, Alphanaphthyl Red, Nile Blue 2B, Nile Blue A, phenacetaline, Methyl Violet, Malachite Green, Para Fuchsine, Oil Blue #603 (products of Orient Kagaku Kogyo K.K.), Oil Pink #312 (products of Orient Kagaku Kogyo K.K.), Oil Red 5B (products of Orient Kagaku Kogyo K.K.), Oil Scarlet #308 (products of Orient Kagaku Kogyo K.K.), Oil Red OG (products of Orient Kagaku Kogyo K.K.), Oil Red RR (products of Orient Kagaku Kogyo K.K.), Oil Green #502 (products of Orient Kagaku Kogyo K.K.), Spiro Red BEH Special (products of Hodogaya Chemical Co., Ltd.), m-cresol purple, Cresol Red, Rhodamine B, Rhodamine 6G, Fast Acid Violet P, Sulforhodamine B, Auramine, 4-p-diethylamino-phenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone, and 1-β-naphthyl-4-p-diethylaminophenylimino-5-pyrazolone.

The compound represented by the foregoing general formula (I) is used in a proportion of from about 0.01 to about 100 parts by weight, preferably from 0.1 to 10 parts by weight, and particularly preferably from 0.5 to 5 parts by weight, for 1 part by weight of a discoloring agent as cited above.

The printing-out composition according to the present invention can function usefully when it is used together with various kinds of light-sensitive materials in photosensitive resist forming compositions which are its object in providing the printing-out property and, as described above, are used for forming printing plates of various kinds, such as lithographic printing plate, etc., IC circuits, photomasks and so on.

Examples of a light-sensitive material used together with the printing-out composition include diazo resins as represented by p-diazodiphenylamine-paraformaldehyde condensates, quinonediazide compounds as represented by o-naphthoquinonediazide, light-crosslinkable resins as represented by a polyvinylcinnamate resin and dimethylmaleinimido group-containing resins, and photopolymerizable compositions constituted of addition polymerizable unsaturated compounds as represented by pentaerythritol tetraacrylate and photopolymerization initiators.

The printing-out composition constituted of the present photodecomposable compound and a discoloring agent can be used together with polymer binders of various kinds in addition to the above-described light-sensitive materials. Suitable examples of such a polymer binder include the same ones as used in combination with photopolymerizing ethylenic unsaturated compounds.

When the foregoing printing-out composition, which is constituted of the photodecomposable compound and the discoloring agent, is incorporated in the photosensitive composition described above, the proportion of the discoloring agent is in the range of 0.001 to 20% by weight, preferably 0.01 to 10% by weight, for the total of the photosensitive composition; while the proportion of the photodecomposable compound is in the range of 0.0001 to 10% by weight, preferably 0.01 to 2% by weight, for the total of the photosensitive composition.

When the photosensitive compositions according to the present invention are used in the form of coating, dimensionally stable sheet-form materials are used as support of the coating. Examples of a sheet-form material with high dimensional stability include paper, papers laminated with plastics (e.g., polyethylene, polypropylene, polystyrene), plates of metals such as aluminum (including alloys thereof), zinc and copper, films of plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc., and papers or plastic films on which thin films of metals as cited above are laminated or deposited.

Of these supports, an aluminum plate is particularly preferred preparing a photosensitive lithographic printing plate because of its markedly high dimensional stability and low price. In addition, a composite sheet consisting of a polyethylene terephthalate film and an aluminum sheet joined thereon is also favorable.

When the support has a metallic surface, especially a surface of aluminum, it is desirable for the support to undergo a surface treatment such as a graining treatment, a dipping treatment in an aqueous solution of sodium silicate, potassium fluorozirconate, a phosphate or the like, or an anodic oxidation treatment.

As for other favorable supports, there can be used any materials for constituting or producing capacitors, semiconductors, multi-layer printed circuits or integrated circuits. Specifically, a thermally oxidized silicon material and/or an optionally doped aluminum-coated silicon material, and base materials generally used in the field of semiconductors, such as silicon nitride, gallium arsenide, indium phosphide, etc. can be used to great advantage. In addition, base materials known in the field of manufacturing liquid crystal display devices, such as glass and indium tin oxide, and further metal plates and foils (e.g., those of aluminum, copper and zinc), double- and triple-layer metal foils, metal-deposited nonconductive sheets, $SiO_2$ materials optionally covered with aluminum, and paper are suitable for support materials. These base materials may be subjected to a thermal pretreatment, a surface roughening treatment, an initial etching treatment or a treatment with some reagent for the purpose of improving upon characteristics required thereof, e.g., intensifying their affinity for water.

The photosensitive compositions of the present invention can further contain dyes, pigments, plasticizers, surfactants, photosensitizers and compounds containing at least two phenolic OH groups which can promote solubility in developers, if needed.

Suitable dyes are oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (which all are products of Orient Chemical Co., Ltd.), Crystal Violet (CI42555), Methyl Violet (CI42535), Rhodamine B (CI45170B), Malachite Green (CI42000), Methylene Blue (CI52015) and so on.

Moreover, the present photosensitive compositions can extent their respective sensitivity regions toward the wavelengths longer than deep ultraviolet region, whereat the photoacid generators used therein have no absorption, by addition of spectral sensitizers as set forth below. As a result thereof, sensitivity to i- or g-line can be induced in the present photosensitive compositions. Suitable examples of such a spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), coronene, and so on. However, spectral sensitizers for the present photosensitive compositions should not be construed as being limited to the above-cited ones.

The present photosensitive compositions are dissolved in solvents capable of dissolving therein all the constituents described above, and coated on supports. Specific examples of a solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, tetrahydrofuran, and the like. These solvents can be used alone or as a mixture of two or more thereof. The proportion of all constituents (the whole solids including additives) for such a solvent is preferably in the range of 2 to 50% by weight.

To the foregoing solvents, surfactants can further be added. Specific examples of a usable surfactant include nonionic surfactants including polyoxyethylene alkyl ethers such as polyoxyethylene lauryl ether, polyoxyethylene stearyl ether, polyoxyethylene cetyl ether, polyoxyethylene oleyl ether; polyoxyethylene alkyl aryl ethers such as polyoxyethylene octyl phenol ether, polyoxyethylene nonyl phenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate; fluorine-containing surfactants such as Eftop EF301, EF303 and EF352 (products of Shin-Akita Kako K.K.), Megafac F171, F173 and F177 (products of Dainippon Ink & Chemicals, Inc.), Fluorad FC430 and FC431 (products of Sumitomo 3M Co.), Asahi Guard AG710, Surflon S-382, SC101, SC102, SC103, SC104, SC105 and SC106 (products of Asahi Glass Company, Ltd.); organopolysiloxane polymers such as KP341 (products of Shin-Etsu Chemical Industry Co., Ltd.); acrylic or methacrylic acid (co)polymers such as Polyflow No. 75 and No. 95 (products of Kyoeisha Oil Chemical Ind. Co., Ltd.); and so on. These surfactants are usually added in an amount of no greater than 2 parts by weight, preferably no greater than one part by weight, per 100 parts by weight of solid contents in the present composition. Additionally, they can be added individually or in combination of two or more thereof.

Developers which can be used for the present photosensitive compositions include aqueous alkaline solutions containing, e.g., inorganic alkalis such as sodium hydroxide, potassium hydroxide, sodium carbonate, sodium hydrogen carbonate, sodium silicate, potassium silicate, sodium metasilicate, sodium tertiary phosphate, sodium secondary phosphate, ammonium tertiary phosphate, ammonium secondary phosphate, aqueous ammonia; primary amines such as ethylamine, n-propylamine; secondary amines such as diethylamine, di-n-butylamine; tertiary amines such as triethylamine, methyldiethylamine; alcohol amines such as dimethyl ethanolamine, triethanolamine; quaternary ammonium salts such as tetramethylammonium hydroxide, tetraethylammonium hydroxide; cyclic amines such as pyrrole, piperidine; or so on. Further, the above-described alkaline aqueous solutions can contain proper amounts of alcohols, such as benzyl alcohol, and surfactants.

Examples of a light source for active rays applicable to the exposure of the present photosensitive compositions include ultra-high pressure, medium pressure and low pressure mercury lamps, a metal halide lamp, a xenon lamp, a chemical lamp, a carbon arc lamp, laser beams of various wavelengths from visible to ultraviolet regions, a fluorescent lamp, a tungsten lamp, and sun light. As for the radiation, electron beams, X-rays, ion beams and deep ultraviolet rays can be used for the exposure. In forming photoresist, it is desirable that the light source be g-line, i-line or deep ultraviolet rays. Scanning or pulse exposure with high-density energy beams (including laser beams or electron beams) can be applied to the exposure of the present photosensitive compositions. As for the laser beams used therein, beams emitted from a He—Ne laser device, an argon laser device, a Krypton ion laser, a He—Cd laser device and a KrF excimer laser device are examples thereof.

The present invention will now be illustrated in more detail by reference to the following examples. However, the invention should not be construed as being limited to these examples. Additionally, in the following examples, all percentages are by weight unless otherwise indicated.

EXAMPLES 1 TO 4

The surface of a 0.30 mm-thick aluminum plate was grained with a nylon brush and an aqueous suspension of 400 mesh pumice powder, and then thoroughly washed with water. The plate thus grained was etched by dipping for 60 seconds in a 10% sodium hydroxide solution heated up to 70° C., and then washed with running water, neutralized with 20% $HNO_3$, and further washed with water. The surface of the resulting plate was roughened electrolytically by supplying the electricity quantity of 160 coulomb/$dm^2$ to the anode using the sine wave alternating current under a condition of $V_A$=12.7 V in a 1% aqueous nitric acid solution. The surface roughness of the thus treated plate was 0.6µ (expressed in terms of Ra). Subsequently, the resulting plate was soaked in a 30% aqueous $H_2SO_4$ solution and desmutted for 2 minutes at 55° C., and then anodically oxidized so as to have a thickness of 2.7 g/$m^2$ under a current density of 2 A/$dm^2$ in a 20% aqueous $H_2SO_4$ solution.

On the thus treated aluminum support, each of the photosensitive compositions described below was coated with a whirler, and dried for 2 minutes at 100° C.:

| | |
|---|---|
| Each of photodecomposable compounds in Table 3 | 0.4 g |
| m/p-Cresol resin (m/p ratio: 6/4) | 2.0 g |
| Crystal Violet | 0.01 g |
| Methyl ethyl ketone | 18 g |
| 2 Methoxyethanol | 6 g |

The dry coverage of each composition was 2.1 g/$m^2$. The thus prepared photosensitive printing plates for lithography were each exposed for 5 minutes through a pattern by means of a low pressure mercury lamp (UISL-112-01, made by Ushio Electric Co., Ltd.). The optical densities of the exposed and unexposed parts were measured with a Macbeth densitometer, thereby determining the density difference. Each of the exposed photosensitive printing plates was developed by dipping for 1 minutes in a 4% aqueous sodium metasilicate solution, and was visually observed as to whether or not the exposed part of the photosensitive layer was eluted to form an image (image formability). The results obtained are shown in Table 3. It is understandable from Table 3 that the inventive photodecomposable compounds combined with the novolak resin provided positive resist image forming photosensitive compositions. Moreover, it can also be seen that the inventive photodecomposable compounds formed print-out images in combination with the dye.

TABLE 3

| Photodecomposable Compound (Compound No.) | Image Formability | Optical Density Difference ΔD |
|---|---|---|
| Example 1 | 3 | Clear image | 0.30 |
| Example 2 | 11 | " | 0.25 |
| Example 3 | 12 | " | 0.17 |
| Example 4 | 14 | " | 0.22 |
| Comparative Example 1 | none | No image (wholly dissolved) | 0.01 |

EXAMPLES 5 TO 7

4 g of a novolak resin (m-cresol/p-cresol ratio of 45/55) having a weight average molecular weight of 7,450 (in terms of polystyrene), 1 g of a dissolution inhibitor represented by the following structural formula and 0.5 g of each photoacid generator according to the present invention, which is set forth in Table 4, were dissolved in 15 g of ethyl cellosolve acetate, and filtered through a 0.2 µm filter to prepare a resist solution. The resist solution was coated on a silicon wafer by means of a spin coater rotating at 2,500 r.p.m., and dried at 120° C. for 60 seconds using a vacuum adsorptive type hot plate to form a resist film having a thickness of 1.0 µm.

The thus formed resist films were each exposed by means of a 248 nm KrF excimer laser stepper (NA=0.42). After the exposure, the films were heated for 60 seconds with the 100° C. vacuum adsorptive type hot plate. Immediately thereafter, the resulting film was dipped for 60 seconds in a 2.38% aqueous tetramethylammonium hydroxide (TMAH) solution, rinsed with water for 30 seconds, and then dried. The thus obtained patterns on the silicon wafers were observed under a scanning electron microscope, and the profile of each resist image was evaluated. The results obtained are shown in Table 4.

Dissolution Inhibitor

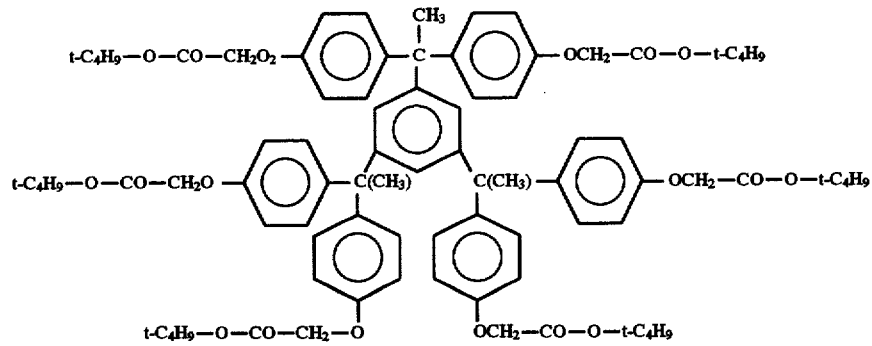

TABLE 4

| | Photoacid Generator (Compound No.) | Exposure Amount (mJ/cm²) | Resolution (μm) |
|---|---|---|---|
| Example 5 | 6 | 30 | 0.40 |
| Example 6 | 8 | 45 | 0.35 |
| Example 7 | 20 | 30 | 0.35 |

EXAMPLES 8 TO 11

2.0 g of a novolak resin (m-cresol/p-cresol ratio of 60/40) having a weight average molecular weight of about 6,000, 0.8 g of a compound having the chemical formula illustrated below and 0.12 g of each sulfonimido compound set forth in Table 5 were dissolved in 8.0 g of dimethylacetamide, and filtered through a 0.4 μm membrane filter to provide a photosensitive composition. The thus prepared photosensitive composition was coated in a thin film of 8,000 Å on a silicon wafer in the same manner as in Example 1. After exposure with the same exposure apparatus as used in Example 1, the resist film was subjected to a puddle development for 45 seconds with a 1.19% aqueous TMAH solution, and examined for the sensitivity, resolution and the residual film after development. The results obtained are shown in Table 5.

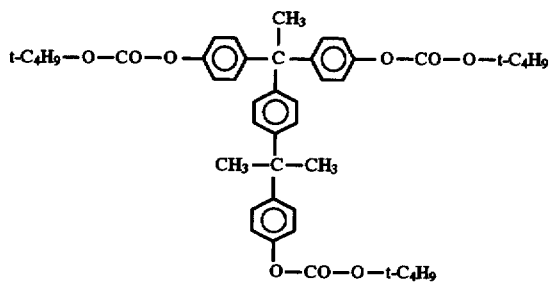

TABLE 5

| | Photoacid Generator (Compound No.) | Exposure Amount (mJ/cm²) | Resolution (μm) | Residual Film after Development |
|---|---|---|---|---|
| Example 8 | 10 | 40 | 0.5 | none |
| Example 9 | 14 | 30 | 0.6 | none |
| Example 10 | 21 | 55 | 0.6 | none |
| Example 11 | 22 | 60 | 0.7 | none |

EXAMPLES 12 TO 16

5 g of a cresol novolak resin (m-cresol/p-cresol ratio=6/4; Mw=4,500), 0.5 g of an acid cross-linking agent containing a methylolated melamine as main component, NIKALAC (trade name, Sanwa Chemical Co., Ltd.) grade MW 30, and 0.1 g of each compound set forth in Table 6 as photoacid generator were dissolved in 17.0 g of ethyl cellosolve acetate, and further filtered through a 0.2 μm microfilter to prepare a photoresist composition. The thus prepared photoresist composition was coated on a clean silicon wafer with a spinner, and dried for 60 seconds on a 90° C. hot plate to form a resist film having a thickness of 1 μm. The obtained resist film was exposed to light through a resolution chart mask by means of an exposure apparatus for reduction projection (i-line, aperture number 0.40) as the exposure amount was changed stepwise, then heated for 120 seconds with a 100° C. hot plate, and further developed for 60 seconds with a 2.38% aqueous tetramethylammonium hydroxide (TMAH) solution. The developed resist film was washed for 30 seconds with water, and then dried.

The sensitivity of the resist film was expressed in terms of the exposure amount required for achieving 50% of the residual film yield in the exposed part of the developed resist film.

The evaluation of the resolution was made as follows: A fine pattern of the resist on the wafer which was formed under the above-described exposure amount was observed under a scanning electron microscope (SEM), and examined for the smallest size at which the resist pattern split down to the base plate surface. At the same time, whether or not the development residue was generated between patterns was also observed under the microscope, thereby making the visual evaluation of the residue.

The results obtained are summarized in Table 6. As can be seen from Table 6, the compositions relating to the present invention were high in sensitivity and resolution, and quite small in development residue.

TABLE 6

| | Photoacid Generator (Compound No.) | Exposure Amount (mJ/cm²) | Resolution (μm) | Development Residue |
|---|---|---|---|---|
| Example 12 | 3 | 60 | 0.55 | none |
| Example 13 | 11 | 90 | 0.6 | none |
| Example 14 | 12 | 70 | 0.55 | none |
| Example 15 | 13 | 90 | 0.5 | none |
| Example 16 | 26 | 120 | 0.5 | none |

EXAMPLES 17 TO 19

On a 100 μm-thick polyethylene terephthalate film, each of the photosensitive compositions described below was coated with a spinner and dried at 100° C. for 2 minutes to form a photosensitive layer. Additionally, the number of revolutions of the spinner per minute was 100.

| | |
|---|---|
| Pentaerythritol tetraacrylate | 1.4 g |
| Benzylmethacrylate-methacrylic acid copolymer (molar ratio in copolymerization = 73:27) | 1.3 g |
| Photoradical generator | 0.13 millimole |
| Methyl ethyl ketone | 12 g |
| Propylene glycol monomethyl ether acetate | 12 g |

On the photosensitive layer thus formed, a 3 wt % aqueous polyvinyl alcohol solution (saponification degree: 86.5–89 mole %, polymerization degree: 1,000) was coated, and dried at 100° C. for 2 minutes.

Each of the thus obtained photosensitive composition was exposed by means of a low pressure mercury lamp, UISL-112-01 (produced by Ushio Electric Co., Ltd.), and dipped in the following developer at 25° C. for 1 minute. Therein, the amount of exposure under which the elution of the exposed part became impossible was determined.

| | |
|---|---|
| Sodium carbonate | 10 g |
| Butyl cellosolve | 5 g |
| Water | 1 l |

As can be seen from Table 7, the photoradical generators according to the present invention ensured high sensitivity.

TABLE 7

| | Photoradical Generator (Compound No. in Table 1) | Exposure Amount (mJ/cm²) |
|---|---|---|
| Example 17 | 12 | 5 |
| Example 18 | 25 | 3 |
| Example 19 | 26 | 10 |

While the invention has been described in detail and with reference to specific embodiments thereof, it will be apparent to one skill in the art that various changes and modification can be made therein without departing from the spirit and scope thereof.

What claimed is:

1. A photosensitive composition comprising:

1) a sulfonimide compound represented by formula (I):

$$R_1-SO_2-NR_3-SO_2-R_2 \qquad (I)$$

wherein $R_1$, $R_2$ and $R_3$ each represents an aromatic group which is a carbon ring containing 6 to 19 carbon atoms or a heterocyclic ring containing 3 to 20 carbon atoms and 1 to 5 heteroatoms;

or an alkyl group which contains 1 to 25 carbons;

wherein said aromatic group or said alkyl group can be substituted by a member selected from the group consisting of an alkoxy group containing 1 to 10 carbon atoms, a halogen atom, an alkoxycarbonyl group containing 2 to 15 carbon atoms, an aryloxycarbonyl group containing 2 to 15 carbon atoms, a hydroxyl group, an acyloxy group containing 2 to 15 carbon atoms, a carbonate group, an ether group, an amino group, a thioether group, an alkenyl group, a nitro group, a cyano group, an acyl group containing 2 to 15 carbon atoms, an aromatic group containing 6 to 19 carbon atoms and a heterocyclic aromatic group;

2) a compound containing at least one acid-cleavable —C—O— or —C—O—Si— linkage which is decomposable upon exposure to acid; and when any of $R_1$, $R_2$ or $R_3$ represents an aromatic group or a heterocyclic aromatic group, it can be substituted by an alkyl group containing 1 to 25 carbon atoms; and 3) a polymer binder.

2. The photosensitive composition as claimed in claim 1, wherein polymer binder is insoluble in water but soluble or capable of swelling in an alkaline aqueous solution.

3. The photosensitive composition as claimed in claim 1, which further contains a compound containing at least two acid-crosslinkable groups.

4. The photosensitive composition as claimed in claim 3, wherein the polymer binder is insoluble in water but soluble or capable of swelling in an alkaline aqueous solution.

5. The photosensitive composition as claimed in claim 1, which further contains a compound containing a polymerizable ethylenic unsaturated bond.

6. The photosensitive composition as claimed in claim 5, wherein the polymer binder is insoluble in water but soluble or capable of swelling in an alkaline aqueous solution.

7. The photosensitive composition as claimed in claim 1, which further contains a compound capable of discoloring under the action of an acid or free radical.

8. The photosensitive composition as claimed in claim 7, wherein the polymer binder is insoluble in water but soluble or capable of swelling in an alkaline aqueous solution.

9. A photosensitive composition comprising:

1) a sulfonimide compound photodecomposable upon exposure and represented by formula (I):

$$R_1-SO_2-NR_3-SO_2-R_2 \qquad (I)$$

wherein $R_1$, $R_2$ and $R_3$ each represents an aromatic group which is a carbon ring containing 6 to 19 carbon atoms or a heterocyclic ring containing 3 to 20 carbon atoms and 1 to 5 heteroatoms; or an alkyl group which contains 1 to 25 carbons;

wherein said aromatic group or said alkyl group can be substituted by a member selected from the group consisting of an alkoxy group containing 1 to 10 carbon atoms, a halogen atom, an alkyoxycarbonyl group containing 2 to 15 carbon atoms, an aryloxycarbonyl group containing 2 to 15 carbon atoms, a hydroxyl group, an acyloxy group containing 2 to 15 carbon atoms, a carbonate group, an ether group, an amino group, a thioether group, an alkenyl group, a nitro group, a cyano group, an acyl group containing 2 to 15 carbon atoms, an aromatic group containing 6 to 19 carbon atoms and a heterocyclic aromatic group; and 2) a polymer binder insoluble in water but soluble or capable of swelling in an alkaline aqueous solution; and when any of $R_1$, $R_2$ or $R_3$ represents an aromatic group or a heterocyclic aromatic group, it can be substituted by an alkyl group containing 1 to 25 carbon atoms.

10. The photosensitive composition as claimed in claim 9, which further contains a compound containing at least one acid-cleavable —C—O—C— or —C—O—Si— linkage.

11. The photosensitive composition as claimed in claim 9, which further contains a compound containing at least two acid-crosslinkage groups.

12. The photosensitive composition as claimed in claim 9, which further contains a compound containing a polymerizable ethylenic unsaturated bond.

13. The photosensitive composition as claimed in claim 9, which further contains a compound capable of discoloring under the action of an acid or free radical.

* * * * *